(12) United States Patent
Benter et al.

(10) Patent No.: US 9,324,548 B1
(45) Date of Patent: Apr. 26, 2016

(54) METHOD AND DEVICE TO INCREASE THE INTERNAL ENERGY OF IONS IN MASS SPECTROMETERS

(71) Applicant: Bruker Daltonik GmbH, Bremen (DE)

(72) Inventors: Thorsten Benter, Haan (DE); Sonja Klee, Wuppertal (DE)

(73) Assignee: Bruker Daltonik GmbH, Bremen (DE)

( * ) Notice: Subject to any disclaimer, the term of this patent is extended or adjusted under 35 U.S.C. 154(b) by 0 days.

(21) Appl. No.: 14/273,202

(22) Filed: May 8, 2014

(51) Int. Cl.
*H01J 49/06* (2006.01)

(52) U.S. Cl.
CPC ..................................... *H01J 49/06* (2013.01)

(58) Field of Classification Search
USPC ....................................... 250/282, 281, 505.1
See application file for complete search history.

(56) References Cited

U.S. PATENT DOCUMENTS

| | | | | |
|---|---|---|---|---|
| 7,081,621 B1* | 7/2006 | Willoughby | ............. | H01J 49/04 250/283 |
| 8,373,120 B2* | 2/2013 | Verentchikov | ........ | H01J 49/062 250/281 |
| 8,618,475 B2* | 12/2013 | Clemmer et al. | ............. | 250/287 |
| 2002/0148959 A1* | 10/2002 | Weiss et al. | ................ | 250/288 |
| 2004/0031920 A1* | 2/2004 | Giles | ................... | G01N 27/622 250/287 |
| 2010/0294923 A1* | 11/2010 | Kenny | ............... | H01J 49/0045 250/282 |
| 2012/0298853 A1* | 11/2012 | Kurulugama | ........ | H01J 49/065 250/282 |
| 2013/0009051 A1* | 1/2013 | Park | ............................. | 250/282 |

OTHER PUBLICATIONS

Gerlich, "Inhomogeneous RF Fields: A Versatile Tool for the Study of Processes with Slow Ions", State-Selected and State-to-State Ion-Molecule Reaction Dynamics. Part 1: Experiment, Edited by Cheuk-Yiu Ng and Michael Baer. Advances in Chemical Physics Series, vol. LXXXII. ISBN 0-471-53258-4 CD 1992 John Wiley & Sons, Inc.

* cited by examiner

*Primary Examiner* — Phillip A Johnston
*Assistant Examiner* — Hsien Tsai
(74) *Attorney, Agent, or Firm* — O'Shea Getz P.C.

(57) ABSTRACT

A method and a device increases (e.g., uniformly) the internal energy of ions, in order to remove water shells or adducts, to decompose clusters or molecular agglomerations, to unfold large folded ions, or to prepare ions for fragmentation with high yield. The ions can be heated at a gas pressure of a few hectopascal viscously dragged through a tube comprising on-axis RF fields with strong axial field components. The ions are introduced, as usual together with entraining gas, into a vacuum system of a mass spectrometer through a small hole or capillary, and are driven by the gas flow through the tube with the RF fields. The RF fields decelerate and re-accelerate the ions, which travel through the tube, in rapid succession mainly in forward and backward direction, thus causing high numbers of collisions with the gas molecules and heating up the ions in a uniform manner.

20 Claims, 2 Drawing Sheets

METHOD AND DEVICE TO INCREASE THE INTERNAL ENERGY OF IONS IN MASS SPECTROMETERS

FIELD OF TECHNOLOGY

The invention relates to a method and a device to increase the internal energy of ions, in order to remove water shells or adducts, to decompose clusters or agglomerations, to unfold large folded ions, or to prepare ions for fragmentation with high yield.

RELATED ART

In mass spectrometry, ions of analyte molecules are often generated at atmospheric pressure outside the vacuum system, e.g., by electrospraying, and introduced together with entraining gas through small holes or inlet capillaries into a first vacuum stage of the mass spectrometer. In this first vacuum stage, the analyte ions are widely separated from the gas molecules and transferred through small apertures into subsequent vacuum stages. By these processes, the internal energy of the analyte ions changes in an uncontrolled way. Within the inlet capillary, mostly thermal conditions prevail due to the nature of the flow. At the outlet of the capillary, usually a supersonic expansion forms, cooling the ions. After a few millimeters, the jet collapses by collisions with slower gas molecules, and the gas is reheated again. Not only the gas temperature, but also the internal energy of the ions increases again by the numerous gas collisions.

Further changes of the internal energy are caused by the mechanisms of the ion transfer into subsequent vacuum stages. If, for instance, an RF ion funnel is used to collect and transfer the ions, some of the ions near to the walls of the funnel are strongly agitated by the RF voltage and heated by gas collisions. On the other hand, some ions remain relatively unaffected.

The internal energy of the ions (sometimes called their "temperature") strongly influences the degree of releasing water molecules or molecules of organic liquids (desolvation), the degree of releasing adduct ions, the degree of disintegration of cluster ions and agglomerations, the folding state of large ions, and generally their susceptibility of being fragmented by different fragmentation processes. In this way, the internal energy of the ions influences the quality of their analysis by mass spectrometry. Hitherto, the temperature of the ions in the mass spectrometer is more or less accidental and by no means homogeneous. There is no real control of their internal temperature.

To improve analytical methods in mass spectrometry, there is a need for a method to control the internal energy of the analytical ions under investigation or ions used as reactant ions in ion-ion processes.

SUMMARY OF THE INVENTION

Ions can be heated, in a first embodiment, directly after their introduction into a first vacuum chamber of the mass spectrometer, at gas pressures of a few hectopascals, by RF fields with strong on-axis field components within a tube. Ions generated outside the vacuum system of the mass spectrometer are introduced, as usual entrained by a gas, into the vacuum system through a small hole or a capillary (or a plurality of holes and/or capillaries). The ions are driven by the gas flow through the tube containing the RF fields with strong axial field components on the axis. The RF fields may be generated by ring electrodes with special quotients $q=a/d$ of ring structure distances a to internal diameters d, preferably in the range between $0.25<q<1.0$. The ring electrodes of the tube thus form a row of three-dimensional ion traps with strong axial fields between the centers of the rings, changing in strength and direction by the period of the RF voltage. The non-vanishing or non-negligible axial field components on the axis of the tube caused by the rapidly oscillating RF voltages distinguish the tube presented herein from other "ion tube" ion guide arrangements that may appear similar at first glance. Ion guide arrangements on the basis of ring structures usually have very narrow rings to build a strong pseudopotential gradient near the surface; in the axis they show almost no potential variation at all.

In preferred embodiments, about 10 to 50 of such aforementioned "3D ion traps" are arranged along the row. The row of traps focuses the ions weakly into the axis of the arrangement; therefore, the RF fields agitate the ions driven through the tube mainly in forward and backward direction. The shaking causes numerous collisions with the gas molecules, heating up the ions in a uniform manner. The RF field can be superimposed by a DC field, either to hold back or to accelerate the ions within the gas flow and to help them surmount the pseudo potential barriers between the individual "3D ion traps" so that they can move on and do not accumulate. The amount of heating of the ions can be controlled by setting RF voltage amplitude and/or frequency, and by direction and/or strength of the DC field.

In other embodiments, the tube may be arranged in other places of the mass spectrometer, for instance, after the opening between a first and a second vacuum chamber.

The inner shape of the tube may be cylindrical, but can also be conical, trumpet-like, or shaped in any other non-cylindrical form. The outlet opening may be slightly restricted to increase the gas pressure inside the tube. The ring electrodes also may be replaced by quadrupolar electrode structures, enhancing the focusing effect. The gas flow in the tube may be replaced by a gas at rest (stagnant gas or bath gas) while simultaneously providing for a driving DC voltage gradient, but this arrangement offers one parameter less (the gas velocity) for the control of the process.

These and other objects, features and advantages of the present invention will become more apparent in light of the following detailed description of preferred embodiments thereof, as illustrated in the accompanying drawings.

DETAILED DESCRIPTION

Figure 1:
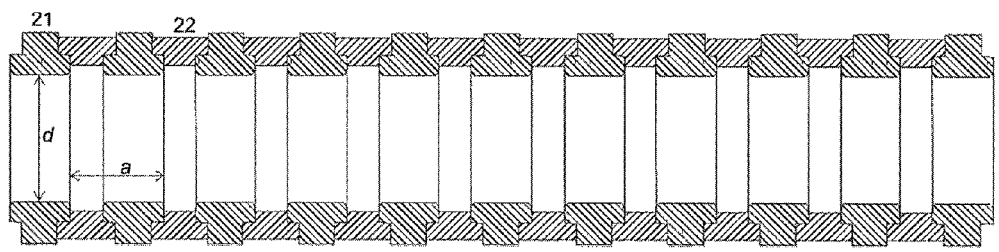
FIG. 1 presents a tube with metallic electrode rings (21) and ceramics distance pieces (22) having roughly a T and inverse-T configuration, soldered together to form a rigid structure. The quotient $q=a/d$ of the axial structure distance a and the inner diameter d amounts to about 0.5 in this example.

According to an aspect of the invention, the internal energy of ions is increased (e.g., uniformly), in order to remove water shells or adducts, to decompose clusters or agglomerations, to unfold large folded ions, or to prepare ions for fragmentation with high yield.

The ions are heated, for instance, after their introduction into a first vacuum chamber of the mass spectrometer, at a gas pressure of a few hectopascal, by RF fields with strong axial components on the axis in a tube. The ions, generated outside the vacuum system of the mass spectrometer, are introduced, together with entraining gas, into the vacuum system through a small hole or capillary, and are driven by the gas flow through the tube in which the RF fields are generated by ring electrodes with special quotients of ring structure distance to internal diameter, thus forming a long row of three-dimensional ion traps. The RF fields agitates (e.g., decelerate and re-accelerate in rapid succession) the ions, which travel through the tube, mainly in forward and backward direction, thus causing numerous collisions with the gas molecules and heating up the ions in a uniform manner. The RF field can be superimposed with a DC field, either to increase or to shorten the duration of stay of the ions within the tube. The amount of heating can be controlled by setting RF voltage amplitude and/or frequency, and by direction and/or strength of the DC field.

In a first embodiment, the ion heating device is located in the first vacuum stage of the mass spectrometer. The gas with entrained ions is directly expanding from the inlet capillary (or inlet orifice) through the special tube carrying the ring electrodes. An inlet capillary of a commercial atmospheric pressure ion source, guiding the ions with entraining gas into the first stage of a differential pumping system with several pressure stages, can feed about one to two liters of gas per minute into the vacuum system of the mass spectrometer.

If a nitrogen gas flow of 1.5 liters per minute at normal temperature and pressure (NTP) conditions is blown into a tube with 10 millimeter inner diameter and 150 millimeter length, with a pressure lower than 100 pascal at its far end, then the pressure inside the tube will amount to at least 200 pascal (2 mbar) near its end, because the gas velocity inside the tube cannot become higher than the speed of sound. The walls of the tube impede the gas expansion and thereby prevent the formation of a supersonic jet. For a given gas, the speed of sound is almost constant; it depends little on pressure and temperature of the gas. For nitrogen, the speed of sound varies between 300 and 350 meters per second over a wide range of conditions. The pressure at the entrance of the tube will be somewhat higher than the 200 pascal at the far end, because the flow is always connected with a pressure gradient. If no DC voltage is applied, the flight time of ions and gas molecules through the tube amounts to at least 500 microseconds.

A favorable design of the tube shows metal rings with, for example, 10 millimeter inner diameter d and about 3 millimeter thickness, isolated from each other by isolating material of about 2 millimeter width, so that the ring structure shows distances a (see FIG. 1) of about 5 millimeter each from ring to ring (q=0.5). If every other ring is connected to a first phase of a two-phase RF voltage, and the remaining rings to the second phase, a row of three-dimensional radio-frequency ion traps is formed. Unlike conventional "ion tube" ion guide arrangements with electrode rings, the voltage along and on the axis shows minima and maxima, with peak-to-peak voltages about half the height of the applied RF peak-to-peak voltage, generating rather strong on-axis RF field components in the direction of the axis of the device. If the ring structure distance a is somewhat larger with respect to the diameter d, also the peak-to-peak voltages along the axis are somewhat higher, and vice versa.

To heat up an ion by increasing its internal energy, the collisions with the gas molecules must have a minimum strength. Quantum theory teaches that only discrete energy portions can be transferred into a molecule which amount to the difference of two internal energy states of the molecule. This always is a finite energy portion, or quantum, the transfer of which requires an impulse and a relative speed of the ion with respect to the gas molecule above certain thresholds. On average, the ions have to be accelerated to a speed above this threshold by the instantaneous electrical field. Because the acceleration takes some time, a minimum field strength and a maximum frequency will be required. For small ions, additionally a minimum mean free path length is required, because each collision decelerates the speed. Large ions in the kilodalton range are much less decelerated by single collisions, therefore, the mean free path is less important, but these larger ions need high voltage gradients lasting for some time by relative low frequencies of the RF, to reach velocities above these energy transfer thresholds and to be heated by the collisions.

The general purpose of heating ions is to cleave bonds and mostly to separate parts of the ions. These may be the bonds of water shell molecules (desolvation), of alkali ion adducts, of parts of ion complexes (e.g., dimers or multimers), or folding bonds. There are different types of bonds: van der Waals bonding (e.g., 5-50 meV), hydrogen bonding (e.g., dipole-dipole-interaction 0.18-1.7 eV), covalent bonding (e.g., 2-7 eV), and many others like ligand bonding, affinity bonding and more.

As an example, let us consider the reduction in size of hydronium cluster ions $[H(H_2O)_n]^+$ which are used for the chemical ionization (CI) of certain classes of analyte molecules. Hydronium cluster ions are formed in different kinds of electrical discharges, in most cases with a broad distribution of cluster sizes about $3 \leq n \leq 9$. For small, non-polar analyte molecules, however, only the basic hydronium ion $H_3O^+$ is really effective for a chemical ionization by protonation. To downsize the hydronium cluster ions by stripping off water molecules, the device described above is used. The hydronium cluster ions are fed, together with analyte molecules and an entraining gas, through the inlet capillary into the ion heating tube described above. Applying an RF voltage of about 200 volt peak-to-peak and a frequency of about 1 megahertz, heats up the cluster to an internal temperature of about 700 K, whereby the water cluster equilibria are strongly shifted to yield elevated average concentrations of the basic hydronium ion. Bare hydronium ions ionize even very non-polar compounds as for example toluene or anisole.

In this above example, rather light ions have been heated up. With heavier ions, e.g., peptides, in the mass range of a few kilodaltons, heating the ions is more difficult, because (i) the higher mass means that much more energy has to be transferred to heat up the ion to a preset temperature, and (ii) it is much harder to accelerate the ions to velocities sufficient to take up energy by collisions with light gas molecules. Increasing the RF voltage to kilovolts helps to get rid of the water shell. However, to split up complex ions, or to unfold ions, also the frequency has to be decreased, to about 100 kilohertz, for instance, to provide longer acceleration times per period.

For distinct purposes, it may be necessary to increase the mean free path length by lowering the gas pressure. This can be done by using a tube with increased inner diameter, or by using an inlet capillary that transports less gas into the tube inside the first vacuum stage. Placing the tube downstream of the opening between first and second vacuum stage, also reduces the pressure and increases the mean free molecular path.

The extent of heating depends on mass m and charge z of the ions. To heat up ions with different masses but equal charge states to about the same temperature, a DC voltage gradient may be applied in such a way that smaller ions with higher ion mobility are accelerated to leave the tube in a shorter time, thus preventing overheating, while larger ions with lower ion mobility remain longer in the tube and experience a longer heating time. The ions with higher masses are heated for a longer time than those of lower masses.

In a similar way, ions of different charge states z but of similar masses m are heated quite differently. Without DC field present, the ions with higher charge z are heated much stronger than ions with lower charge. If ions of similar masses m but different charges z shall be heated to about the same temperature, again a DC gradient has to be applied, which drives the ions to the exit of the tube. The ions with higher numbers z of charges have higher ion mobilities and are driven faster out of the tube, preventing high charge state ions to be overheated.

In this way, ions of different masses and different charge states may be heated in a first order to about the same temperature by an accelerating DC field along the tube. This effect may be supported by other techniques, for instance, by an elevated pressure generated by a small restriction at the end of the tube which not only increases the pressure but also reduces the gas velocity and thus the dwell time of the ions inside the tube.

Inside the tube, the pressure decreases gradually from the entrance to the exit, and the gas velocity increases correspondingly. To generate a constant pressure, the shape of the tube may be chosen differently from a cylindrical shape. A conical or trumpet-like shape with larger opening toward the entrance leads to a less pronounced pressure gradient, but increases the velocity gradient. With a constant tube pressure, heating becomes more constant along the entire tube because the number of collisions per unit of time remains constant. With an opening towards the exit, the velocity becomes more constant, while the pressure gradient increases.

Figure 2:
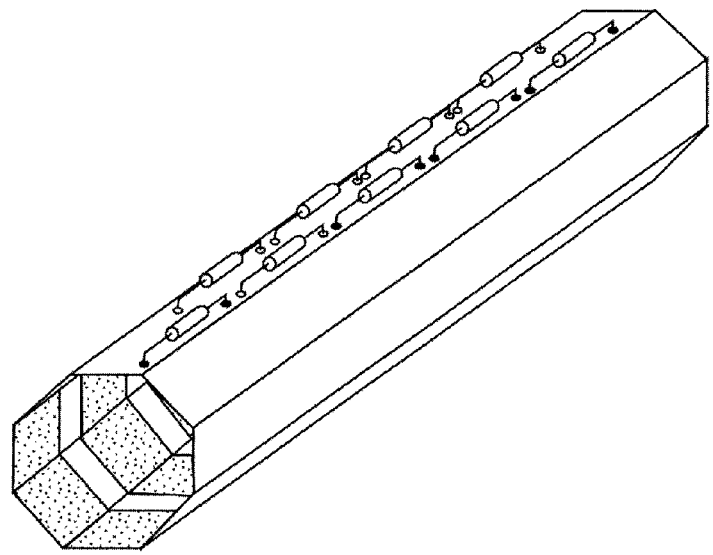
FIG. 2 shows a simpler device, formed from a partially flexible printed circuit board (PCB) which has been folded into the depicted octagonal shape, and carrying parts of the electronic circuits applying the RF and DC voltages. In the inner circumference, the unfilled or blank areas denote the electrodes whereas the dotted areas include an insulating board material.
Figure 3:
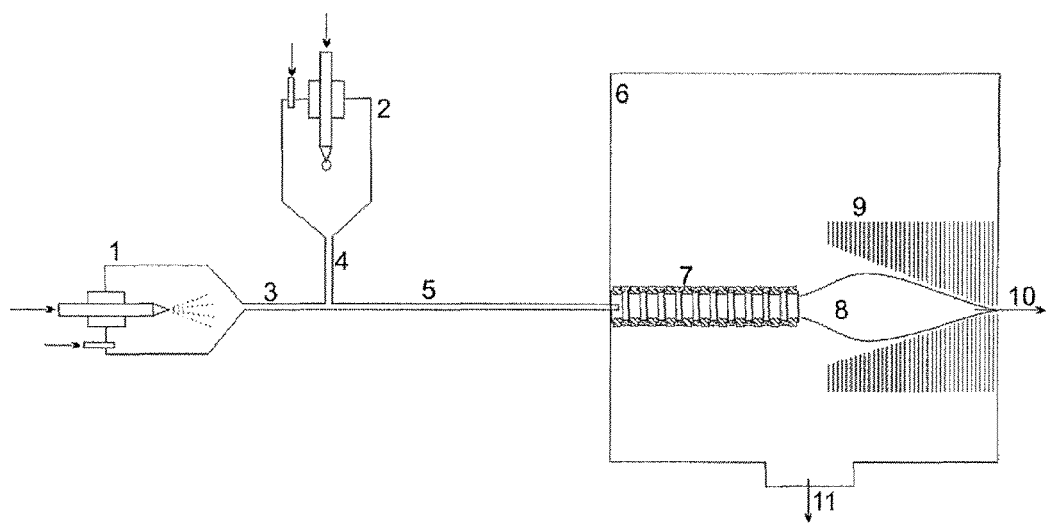
FIG. 3 depicts the tube (7) of FIG. 1 built into an arrangement for the ionization of substances by hydronium ion CI, comprising an electrospray ion source (1), a cell (2) for the generation of hydronium ions, capillaries (3, 4, 5) to guide the ions into the first stage (6) of a differential pumping system of a mass spectrometer, pumped by vacuum pump (11). Within this first stage, the gas with entrained ions is expanding into the tube (7) where the ions are heated up by RF fields causing numerous collisions. The cloud (8) of ions leaving tube (7) is caught and focused by the ion funnel (9) and transferred as a beam (10) into the next vacuum stage. The function of the electrospray ion source (1) and the hydronium ion generator (2) is explained in detail in patent application DE 2013 006 971.8 which is incorporated herein by reference in its entirety.

There are many ways to fabricate this tube. In FIG. 1, the tube is made from metal and ceramic rings, soldered together to form a rigid structure. For example, about ten to 50 rings (or even more) may build up a row of "ion traps". On the other hand, the tube can be folded by a correspondingly formed flexible printed circuit board, as shown in FIG. 2. On the outside, the PCB may carry circuit parts for the electric supply with RF and DC voltages. Even a tube made from glass, ceramics or quartz may be used, with conductive layers on the inner surface to build the electrode rings.

The invention has been shown and described with reference to a number of different embodiments thereof. It will be understood, however, that various aspects or details of the invention may be changed, or various aspects or details of different embodiments may be arbitrarily combined, if practicable, without departing from the scope of the invention. Generally, the foregoing description is for the purpose of illustration only, and not for the purpose of limiting the invention which is defined solely by the appended claims.

What is claimed is:

1. A device for increasing an internal energy of ions in a mass spectrometer, comprising:
   an essentially closed tube with a plurality of concentric electrode rings surrounding an axis of the tube, wherein the tube comprises a flexible board of electrically insulating material which has been formed into a tube shape and internally carries conductive layers for the electrode rings;
   a device to inject gas-entrained ions into the tube; and
   an RF voltage generator that applies RF voltages to the electrode rings of the tube in such a way that an RF field inside comprises axial field components on the axis of the tube.

2. The device according to claim 1, wherein the device to inject gas-entrained ions into the tube comprises one of an orifice and a capillary reaching from an ionizing region held essentially at atmospheric pressure into a first stage of a vacuum system of the mass spectrometer.

3. The device according to claim 1, further comprising a DC voltage generator to form a DC voltage gradient along the row of electrode rings of the tube.

4. The device according to claim 3, wherein at least one of an amplitude or frequency of the RF voltage and a direction or strength of the DC voltage gradient is adjustable.

5. The device according to claim 1, wherein the flexible board of electrically insulating material comprises a printed circuit board.

6. The device according to claim 1, wherein a shape of the tube is one of cylindrical, conical, and trumpet-like.

7. A method to increase the internal energy of ions in a mass spectrometer, comprising the steps:
   providing an essentially closed tube with concentric electrodes surrounding an axis of the tube, wherein the tube comprises a flexible board of electrically insulating material which has been formed into a tube shape and internally carries conductive layers for the electrode rings;
   providing phases of an RF voltage alternately applied to the electrodes of the tube;
   injecting gas-entrained ions into the tube, wherein the ions are decelerated and reaccelerated in rapid succession in a substantially axial direction by an RF field inside the tube and acquire internal energy by collisions with the gas molecules;
   providing an additional DC voltage at the electrodes to further accelerate or decelerate the ions within the gas flow inside the tube.

8. The method according to claim 7, wherein the gas injected into the tube comprises nitrogen.

9. The method according to claim 7, wherein the ions, the internal energy of which is to be increased, are hydronium cluster ions.

10. The method according to claim 7, wherein the ions are generated from high molecular weight substrates.

11. The method according to claim 10, wherein the ions are generated from one of peptides or proteins.

12. The method according to claim 7, wherein at least one of the RF and DC voltages is adjusted to control the increase in the internal energy of the ions.

13. The method according to claim 12, further comprising choosing method parameters such that one of (i) solvent shells or adducts are removed from the ions, (ii) ion complexes are split, (iii) folded ions are unfolded, (iv) the ions are heated to facilitate subsequent fragmentation of the ions, and (v) the average cluster size of hydronium cluster ions is decreased in a controlled fashion.

14. The method according to claim 7, further comprising simultaneously increasing the internal energy of various ion species having different masses but equal charge states to about the same level, wherein a DC voltage gradient is applied to the electrodes in such a way that smaller or lighter ions having higher ion mobility are accelerated to leave the tube in a shorter time, thus preventing overheating, while larger or heavier ions having lower ion mobility remain longer in the tube and experience a correspondingly longer heating time.

15. The method according to claim 7, further comprising simultaneously increasing the internal energy of various ion species having similar masses m but different charge states z to about the same level, wherein a DC voltage gradient is applied to the electrodes in such a way that all ions are driven to the tube exit, thereby driving ions having a higher number z of charges and consequently higher ion mobility faster out of the tube compared to ions having a lower charge state and therefore lower ion mobility.

16. The device according to claim 1, wherein the electrode rings have a quadrupolar structure in order to enhance a focusing effect.

17. An ion guide arrangement comprising:
 a flexible board of electrically insulating material which has been formed into the shape of a substantially closed tube and internally carries a plurality of conductive annular layers for forming a plurality of electrode rings; and
 a voltage generator that supplies two phases of an RF voltage alternately to the electrode rings in order that a strong pseudopotential gradient is built near the surface of the electrode rings that contains ions radially.

18. The ion guide arrangement according to claim 17, wherein the flexible board of electrically insulating material is a printed circuit board.

19. The ion guide arrangement according to claim 17 being located in a stage of a vacuum system of a mass spectrometer.

20. The ion guide arrangement according to claim 17, further comprising a DC voltage generator in order to establish a DC voltage gradient along an axis of the tube.

\* \* \* \* \*